(12) United States Patent
Kim et al.

(10) Patent No.: US 8,546,870 B2
(45) Date of Patent: Oct. 1, 2013

(54) SEMICONDUCTOR DEVICES HAVING GATE STRUCTURES WITH CONDUCTIVE PATTERNS OF DIFFERENT WIDTHS AND METHODS OF FABRICATING SUCH DEVICES

(75) Inventors: Ju-Hyung Kim, Seongnam-si (KR);
Chang-Seok Kang, Seongnam-si (KR);
Sung-Il Chang, Suwon-si (KR);
Young-Woo Park, Seoul (KR);
Jung-Dal Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 457 days.

(21) Appl. No.: 12/622,594

(22) Filed: Nov. 20, 2009

(65) Prior Publication Data
US 2010/0133604 A1 Jun. 3, 2010

(30) Foreign Application Priority Data
Nov. 28, 2008 (KR) .................. 10-2008-0119886

(51) Int. Cl.
*H01L 29/792* (2006.01)
(52) U.S. Cl.
USPC .................. 257/324; 257/E29.309

(58) Field of Classification Search
USPC ............................ 257/324, E29.309
See application file for complete search history.

(56) References Cited

U.S. PATENT DOCUMENTS

| 6,521,963 | B1 * | 2/2003 | Ota et al. ............... 257/412 |
| 6,908,814 | B2 | 6/2005 | Jeng et al. |
| 2006/0081916 | A1 * | 4/2006 | Sohn et al. .............. 257/321 |
| 2008/0061360 | A1 * | 3/2008 | Oh et al. ................ 257/324 |
| 2008/0067581 | A1 | 3/2008 | Hong et al. |

FOREIGN PATENT DOCUMENTS

| KR | 100759845 B1 | 9/2007 |
| KR | 2007090352 A * | 9/2007 |
| KR | 1020070090352 A | 9/2007 |

* cited by examiner

*Primary Examiner* — Marvin Payen
(74) *Attorney, Agent, or Firm* — Myers Bigel Sibley & Sajovec, P.A.

(57) ABSTRACT

A semiconductor device and a method of fabricating the same are provided. The semiconductor device includes a first dielectric pattern, a data storage pattern and a second dielectric pattern, which are sequentially stacked on a semiconductor substrate. A first conductive pattern is provided on the second dielectric pattern. A second conductive pattern having a greater width than the first conductive pattern is provided on the first conductive pattern.

7 Claims, 6 Drawing Sheets

SEMICONDUCTOR DEVICES HAVING GATE STRUCTURES WITH CONDUCTIVE PATTERNS OF DIFFERENT WIDTHS AND METHODS OF FABRICATING SUCH DEVICES

CROSS-REFERENCE TO RELATED APPLICATION

This application claims priority under 35 U.S.C. §119 to Korean Patent Application No. 10-2008-0119886, filed on Nov. 28, 2008, the entire contents of which are hereby incorporated herein by reference.

FIELD OF THE INVENTION

The present invention relates to semiconductor devices and, more particularly, to semiconductor devices having conductive patterns of different widths, and to methods of fabricating such devices.

BACKGROUND

Semiconductor devices include volatile memory devices such as dynamic random access memory devices, and non-volatile memory devices such as, for example, flash memory devices. Flash memory devices are characterized in that they maintain data stored in flash memory cells thereof even when power to the device is cut off.

SUMMARY

Pursuant to embodiments of the present invention, semiconductor devices are provided that include a first dielectric pattern on a semiconductor substrate, a data storage pattern on the first dielectric pattern, a second dielectric pattern on the data storage pattern, a first conductive pattern on the second dielectric pattern and a second conductive pattern on the first conductive pattern. The first conductive pattern has a first width that is less than a second width of the second conductive pattern.

In some embodiments, the second dielectric pattern may have a third width that is greater than the first width. The first conductive pattern may comprise a first material and the second conductive pattern may comprise a second material that is different from the first material. The sidewalls of the second conductive pattern may be vertically aligned with sidewalls of the second dielectric pattern. The second dielectric pattern may have a third width that is greater than the second width. The data storage pattern may be a charge trap layer of a non-volatile memory device. The second conductive pattern may be thicker than the first conductive pattern. The second conductive layer may have a higher electrical conductivity than the first conductive layer.

Pursuant to further embodiments of the present invention, methods of fabricating a semiconductor device are provided in which a first dielectric layer, a data storage layer and a second dielectric layer are sequentially formed on a semiconductor substrate. A first conductive layer and a second conductive layer are sequentially formed on the second dielectric layer. The data storage layer, the second dielectric layer and the first and second conductive layers are patterned to form a data storage pattern, a second dielectric pattern, a first preliminary conductive pattern and a second conductive pattern, which are sequentially stacked. The width of the first preliminary conductive pattern is reduced so that a first conductive pattern is formed to have a smaller width than the second conductive pattern.

Pursuant to still further embodiments of the present invention, methods of fabricating a semiconductor device are provided in which a first dielectric layer, a data storage layer and a second dielectric layer are sequentially formed on a semiconductor substrate. A first conductive layer and a second conductive layer are sequentially formed on the second dielectric layer. The first and second conductive layers are patterned to form a first preliminary conductive pattern and a second conductive pattern, which are sequentially stacked. An oxidation or etching process is performed to reduce the width of the first preliminary conductive pattern to form a first conductive pattern that has a width that is smaller than a width of the second conductive pattern. The second dielectric layer and the data storage layer are etched using the second conductive pattern as an etch mask to form a data storage pattern and a second dielectric pattern, which are sequentially stacked, where the second dielectric pattern has a greater width than the first conductive pattern.

BRIEF DESCRIPTION OF THE DRAWINGS

Certain embodiments of the present invention are described in further detail below with reference to the accompanying drawings.

DETAILED DESCRIPTION

Figure 1A:
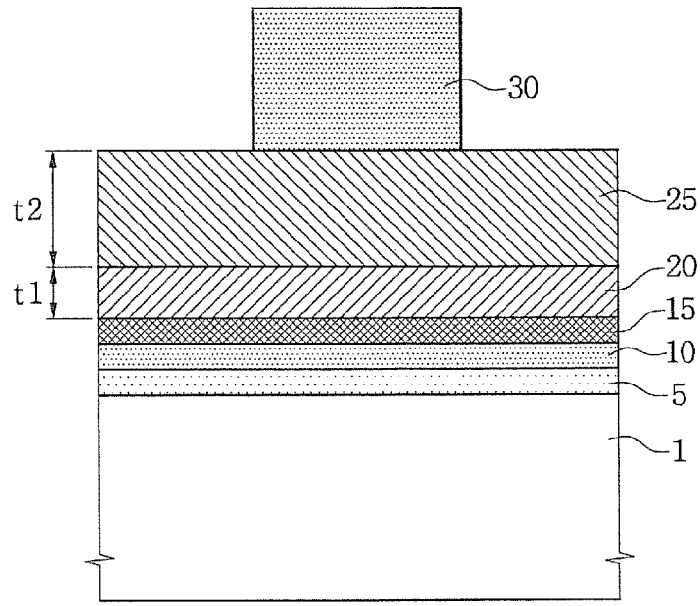
FIGS. 1A to 1C are cross-sectional views illustrating methods of forming a semiconductor device according to certain embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", etc.).

Relative terms such as "under" or "above" or "upper" or "lower" and the like may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, and/or elements, but do not preclude the presence or addition of one or more other features, operations, elements, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Hereinafter, a transistor and a semiconductor memory cell that includes the transistor will be described more fully with reference to the accompanying drawings in which certain embodiments of the present invention are shown.

Figure 1B:
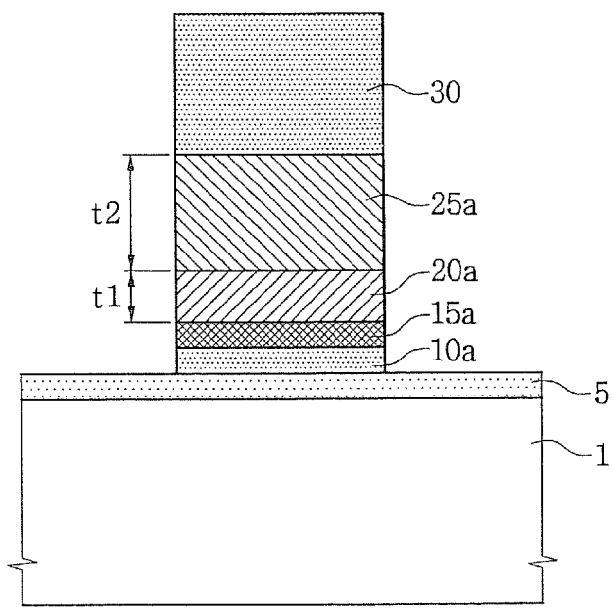
Figure 1C:
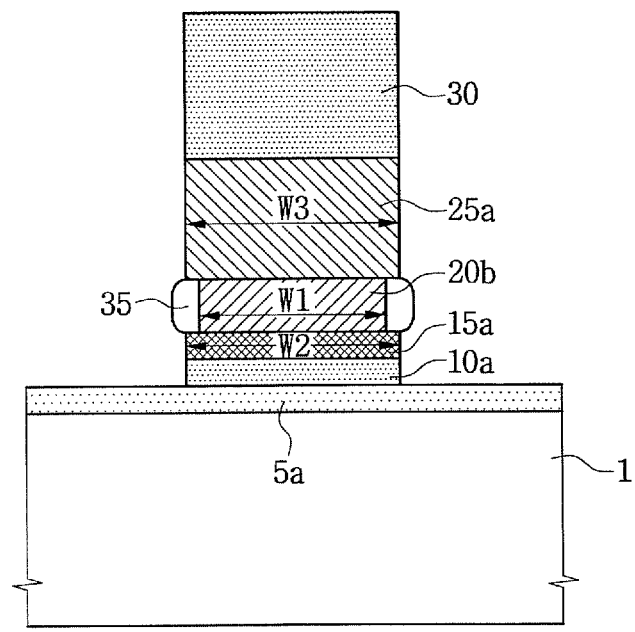
Figure 2:
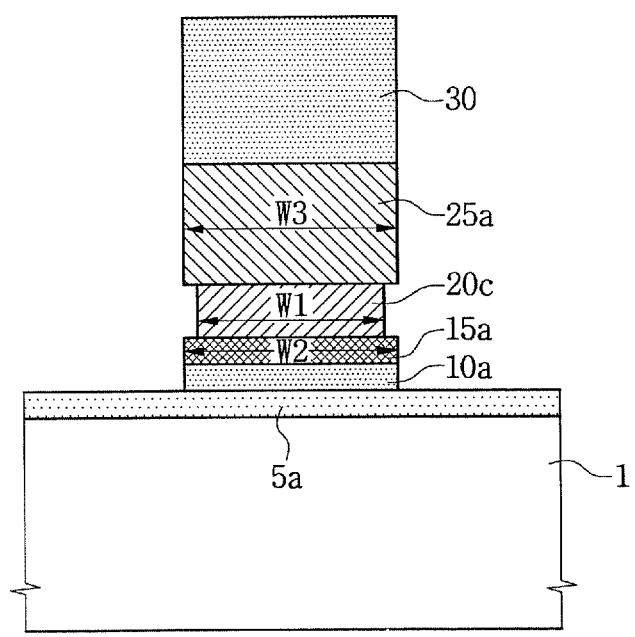
FIG. 2 is a cross-sectional view of a semiconductor device according to further embodiments of the present invention.
Figure 3A:
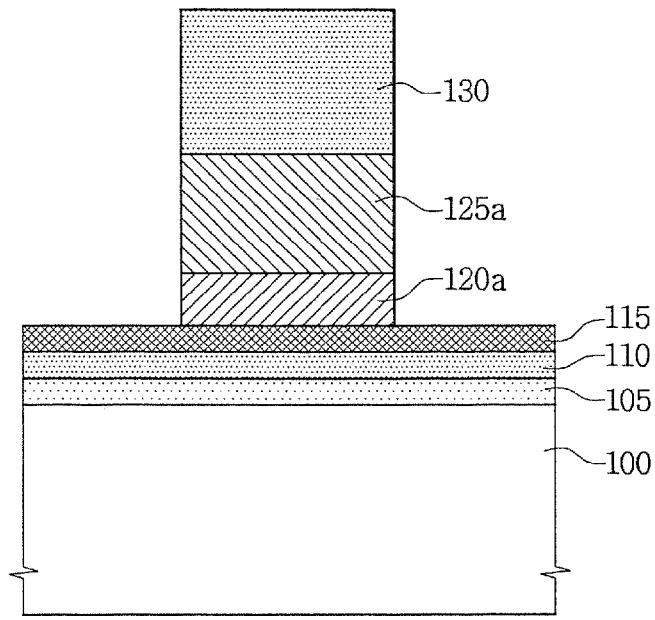
FIGS. 3A to 3C are cross-sectional views illustrating methods of forming a semiconductor device according to still further embodiments of the present invention.
Figure 3B:
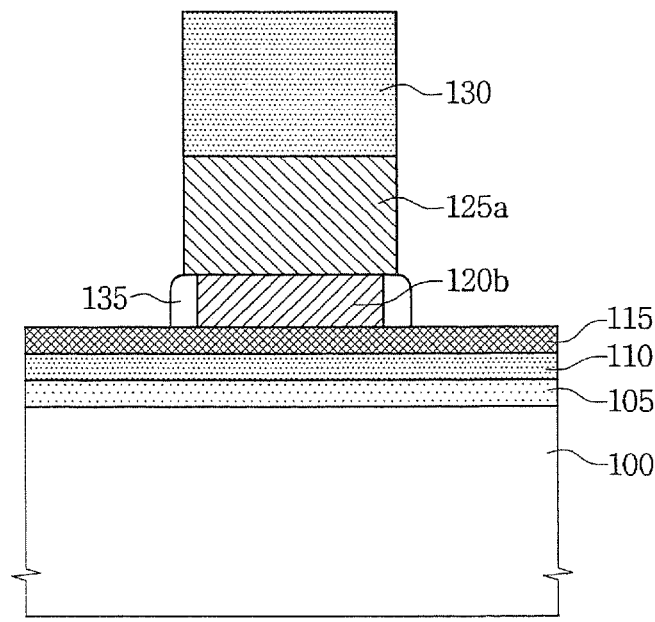
Figure 3C:
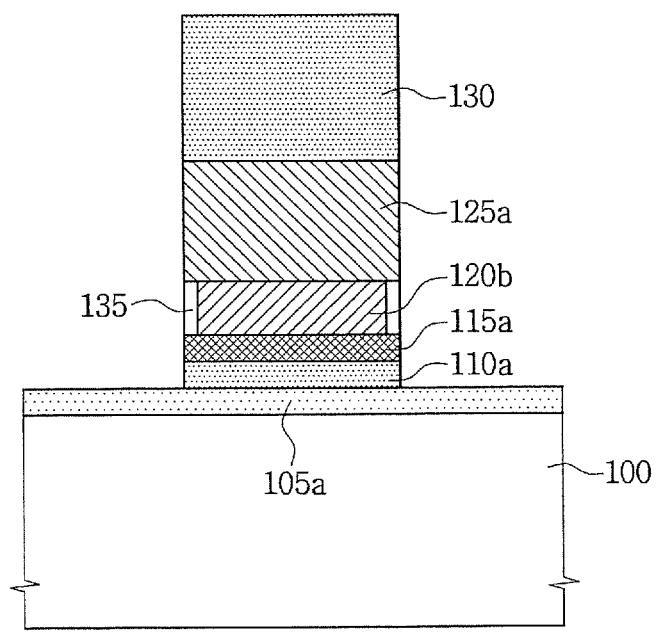
Figure 4A:
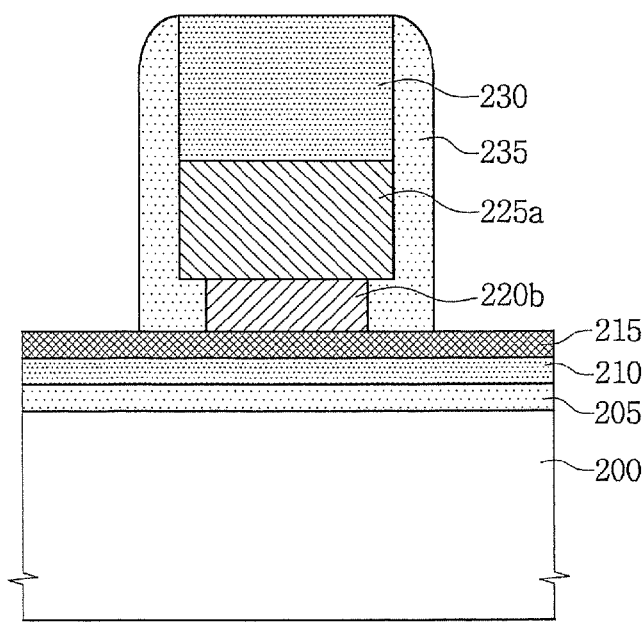
FIGS. 4A and 4B are cross-sectional views illustrating methods of forming a semiconductor device according to additional embodiments of the present invention.
Figure 4B:
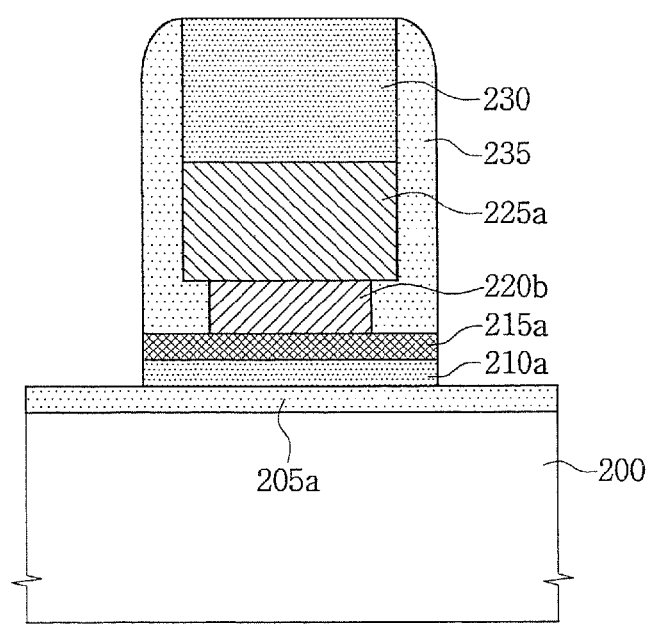

FIGS. 1A to 1C are cross-sectional views illustrating methods of forming a semiconductor device according to certain embodiments of the present invention. FIG. 2 is a cross-sectional view of a semiconductor device according to further embodiments of the present invention. FIGS. 3A to 3C are cross-sectional views illustrating methods of forming a semiconductor device according to still further embodiments of the present invention. FIGS. 4A and 4B are cross-sectional views illustrating methods of forming a semiconductor device according to yet another embodiment of the present invention.

Referring first to FIG. 1C, a semiconductor substrate 1 having a field region (not shown in the figures) and an active region may be prepared. The semiconductor substrate 1 may be a semiconductor wafer or layer formed using a semiconductor material such as silicon. For example, the semiconductor substrate 1 may be a single crystalline semiconductor substrate. As another example, the semiconductor substrate 1 may be alternatively be a single crystalline semiconductor body layer 1 that is provided on a semiconductor substrate or on an insulator (e.g., a silicon on insulator or "SOI" substrate). The semiconductor substrate 1 may comprise, for example, a silicon (Si) substrate, a germanium (Ge) substrate or a silicon germanium (SiGe) substrate. The active region of the semiconductor substrate 1 may be defined by an isolation region (not shown in the figures) that is formed in the field region. The isolation region may be formed, for example, by a shallow trench isolation (STI) process.

A first dielectric pattern 5a, a data storage pattern 10a, and a second dielectric pattern 15a are sequentially stacked on the semiconductor substrate 1.

The first dielectric pattern 5a may be a tunnel dielectric layer. The tunnel dielectric layer may be formed of at least one selected from a silicon oxide (SiO) layer, a silicon oxynitride (SiON) layer, a nitrogen-doped silicon oxide layer and a high-k dielectric layer. The first dielectric pattern may comprise a dielectric material having a higher dielectric constant than silicon oxide such as, for example, aluminum oxide (AlO), zirconium oxide (ZrO), hafnium oxide (HfO) and/or lanthanium oxide (LaO).

The data storage pattern 10a may be a data storage region of a non-volatile memory device such as a flash memory. The data storage pattern 10a may be a layer that has traps capable of storing charges. For example, the data storage pattern 10a may be a charge trap layer of a flash memory device. In some embodiments, the data storage pattern 10a may comprise a material capable of trapping an electron injected from the semiconductor substrate 1 through the first dielectric pattern 5a to retain the electron or capable of erasing the trapped electron according to the operating condition of the device.

The data storage pattern 10a may comprise at least one layer selected from a SiON layer, a SiN layer and a high-K dielectric layer. The data storage pattern 10a may include at least one of a silicon quantum dot, a germanium quantum dot, a metal quantum dot and a nanocrystal. In some nanocrystal embodiments, the nanocrystal may comprise one selected from the group of tungsten (W), titanium (Ti), tantalum (Ta), copper (Cu), molybdenum (Mo), nickel (Ni) and nitrides thereof. In other nanocrystal embodiments, the nanocrystal may be at least one oxide nanocrystal selected from the group of zirconium (Zr) oxide, hafnium (Hf) oxide, yttrium (Y) oxide and aluminum (Al) oxide. In still other nanocrystal embodiments, the nanocrystal may be a silicon nanocrystal, a Ge nanocrystal, a silicon nitride nanocrystal, a boron nanocrystal or a boron nitride nanocrystal. The data storage pattern 10a may also be formed of a material layer capable of retaining an electron such as a Si layer, a Ge layer or a Si—Ge layer.

The second dielectric pattern 15a may be a blocking dielectric layer. The second dielectric pattern 15a may comprise, for example, a high-k dielectric layer.

A gate structure including a first conductive pattern 20b and a second conductive pattern 25a, may be sequentially stacked on the second dielectric pattern 15a. The first conductive pattern 20b may comprise at least one of a metal layer, a metal silicide layer, a metal nitride layer, a doped Si layer, a doped Ge layer, and a doped Si—Ge layer. The second conductive pattern 25a may comprise at least one of a metal layer, a metal silicide layer, a metal nitride layer, a doped Si layer, a doped Ge layer, and a doped Si—Ge layer.

The first conductive pattern 20b may include conductive material(s) that are different than the conductive material(s) included in the second conductive pattern 25a. For example, the first and second conductive patterns 20b and 25a may include different conductive material layers from each other selected from a titanium layer, a tantalum layer, a tungsten layer, a nickel layer, a hafnium layer, a niobium layer, a molybdenum layer, an iridium layer, a platinum layer, a cobalt layer, a chrome layer, a palladium layer, a titanium nitride layer, a tantalum nitride layer, a tungsten nitride layer, a molybdenum nitride layer, a ruthenium oxide (RuO) layer, a titanium aluminum nitride (TiAlN) layer, a tungsten silicide layer, a nickel silicide layer, a cobalt silicide layer, a tantalum silicide layer, a doped Si layer, a doped Ge layer and a doped Si—Ge layer.

In some example embodiments, material types of the first and second conductive patterns 20b and 25a may be selected such that an oxide layer grown from the first conductive pattern 20b is formed thicker than an oxide layer grown from the second conductive pattern 25a under the same oxidation process conditions. For example, the first conductive pattern 20b may comprise a titanium layer, and the second conductive pattern 25a may comprise a tungsten layer. As another example, the first conductive pattern 20b may comprise a polysilicon layer, and the second conductive pattern 25a may comprise a metal layer.

In other embodiments, the first conductive pattern 20b may comprise a material layer having an etch selectivity with respect to the second conductive pattern 25a.

A sidewall insulating layer 35 may be provided on at least one sidewall of the first conductive pattern 20b. The sidewall insulating layer 35 may comprise, for example, an oxide layer that is grown from the sidewall(s) of the first conductive pattern 20b.

Figure 1D:
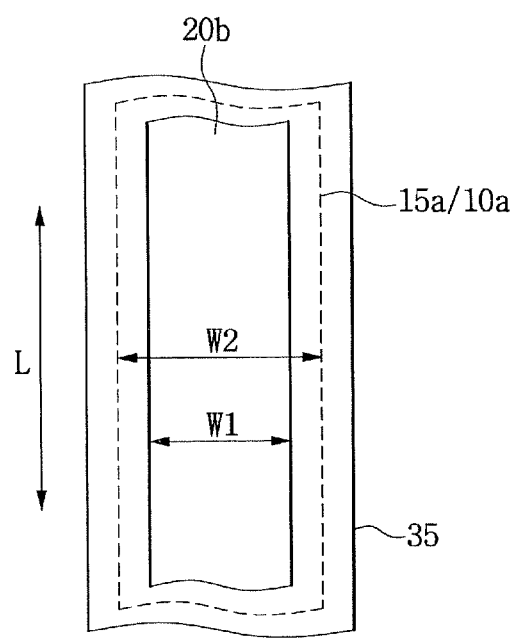
FIG. 1D is a plan view of the device of FIG. 1C with various patterns removed for illustrative purposes.

The semiconductor substrate 1 has a top surface and a bottom surface. The first and second dielectric patterns 5a, 15a, the data storage pattern 10a, and the first and second conductive patterns 20b, 25a are provided on the top surface of the substrate 1. FIG. 1D is a plan view of the device of FIG. 1C with patterns 25a and 30 removed for illustrative purposes. As shown in FIG. 1D, the data storage pattern 10a, the second dielectric pattern 15a and the first conductive pattern 20b extend in a longitudinal direction "L" along the substrate 1. The first conductive pattern 20b has a first width "W1" and the second dielectric pattern has a second width "W2." As shown in FIG. 1D, herein references to the "width" of a pattern refer to the shorter of the two dimensions of the pattern when the pattern is viewed from above the substrate 1. In other words (as shown in FIG. 1C), the "width" of a pattern is the width of a cross section of the pattern that is taken normal to the longitudinal direction of the pattern. As shown in FIGS. 1C and 1D, the width W2 of the second dielectric pattern 15a may be greater than the width W1 of the first conductive pattern 20b. As shown in FIGS. 1C and 1D, substantially the entirety of the sidewalls of the first conductive pattern 20b may have the reduced width W1.

Flash memory cells that have the configuration shown in FIG. 1C may facilitate reducing an electron back-tunneling phenomenon at an edge of the first conductive pattern 20b of the gate structure, which may be caused by an electric field, during erase operations of the flash memory device. Moreover, hole tunneling from the semiconductor substrate 1 may be increased. Therefore, erase operating characteristics of the flash memory device may be enhanced.

The second conductive pattern 25a may have a greater width than the first conductive pattern 20b. Also, the second conductive pattern 25a may be thicker than the first conductive pattern 20b, where herein the "thickness" of a layer or pattern refers to its length in a direction that is normal to the top surface of the substrate 1. Thus, the resistance of the second conductive pattern 25a may be reduced by enlarging its width and/or thickness. As a result, a signal transmission rate of a semiconductor device may be enhanced.

FIG. 4B illustrates a semiconductor device according to further embodiments of the present invention. As shown in FIG. 4B, the semiconductor device may include a second dielectric pattern 215a, a first conductive pattern 220b and a second conductive pattern 225a that correspond to the second dielectric pattern 15a, the first conductive pattern 20b and the second conductive pattern 25a, respectively, of FIG. 1C. In FIG. 1C, the sidewalls of the second dielectric pattern 15a and the second conductive pattern 25a are vertically aligned, as the second dielectric pattern 15a has the same width as the second conductive pattern 25a. As illustrated in FIG. 4B, in other embodiments the second dielectric pattern 215a may have, for example, a greater width than the second conductive pattern 225a. Moreover, as further shown in FIG. 4B, insulating spacers 235 may be provided on the sidewalls of the first and second conductive patterns 220b and 225a.

Methods of fabricating semiconductor devices according to certain embodiments of the present invention will now be described.

First, a method of fabricating a semiconductor device according to first embodiments of the present invention will be described with reference to FIGS. 1A to 1C.

Referring to FIG. 1A, a semiconductor substrate 1 may be prepared. The substrate 1 may be a semiconductor wafer formed of a semiconductor material such as silicon. For example, the substrate 1 may be a single crystalline semiconductor substrate or a silicon on insulator (SOI) substrate having a single crystalline semiconductor body layer. The single crystalline semiconductor substrate or the single crystalline semiconductor body layer may comprise, for example, a Si layer, a Ge layer or a SiGe layer. An active region of the semiconductor substrate 1 may be defined by forming an isolation region (not shown) in the field region. The isolation region (not shown) may be formed by a shallow trench isolation (STI) process.

A first dielectric layer 5, a data storage layer 10, and a second dielectric layer 15 may be sequentially formed on the substrate 1.

The first dielectric layer 5 may be a tunnel dielectric layer. Here, the tunnel dielectric layer may comprise at least one layer selected from a silicon oxide layer, a silicon oxynitride layer (SiON layer), a nitrogen-doped Si oxide layer and a high-k dielectric layer. The high-k dielectric layer may include a dielectric layer having a higher dielectric constant than a silicon oxide layer such as, for example, an aluminum oxide (AlO) layer, a zirconium oxide (ZrO) layer, a hafnium oxide (HfO) layer, and/or a lanthanium oxide (LaO) layer.

The data storage pattern 10 may be a data storage region of a non-volatile memory device such as a flash memory. For example, the data storage pattern 10 may be a layer that has traps capable of storing charges. The data storage layer 10 may include at least one selected from a SiON layer, a SiN layer and a high-k dielectric layer. The data storage layer 10 may include at least one of a silicon quantum dot, a germanium quantum dot, a metal quantum dot and a nanocrystal. In embodiments that include a nanocrystal, the nanocrystal may be formed of one selected from tungsten (W), titanium (Ti), tantalum (Ta), copper (Cu), molybdenum (Mo), nickel (Ni), and a nitride thereof. In further embodiments that include a nanocrystal, the nanocrystal may be at least an oxide nanocrystal selected from the group of zirconium (Zr) oxide, hafnium (Hf) oxide, yttrium (Y) oxide, and aluminum (Al) oxide. In still further embodiments that include a nanocrystal, the nanocrystal may be a silicon nanocrystal, a Ge nanocrystal, a silicon nitride nanocrystal, a boron nanocrystal or a boron nitride nanocrystal. The data storage layer 10 may comprise a material layer capable of retaining an electron such as, for example, a Si layer, a Ge layer or a Si—Ge layer.

The second dielectric layer 15 may be a blocking dielectric layer. The second dielectric layer 15 may comprise a high-k dielectric layer.

A first conductive layer 20 and a second conductive layer 25, which are sequentially stacked, may be formed on the second dielectric layer 15. The first conductive layer 20 may include at least one of a metal layer, a metal silicide layer, a metal nitride layer, a doped Si layer, a doped Ge layer, and a doped Si—Ge layer. The second conductive layer 25 may include at least one of a metal layer, a metal silicide layer, a metal nitride layer, a doped Si layer, a doped Ge layer, and a doped Si—Ge layer. For example, the first and second conductive layers 20 and 25 may each comprise at least one of a titanium layer, a tantalum layer, a tungsten layer, a nickel layer, a hafnium layer, a niobium layer, a molybdenum layer, an iridium layer, a platinum layer, a cobalt layer, a chrome layer, a palladium layer, a titanium nitride layer, a tantalum nitride layer, a tungsten nitride layer, a molybdenum nitride layer, a ruthenium oxide (RuO) layer, a titanium aluminum nitride (TiAlN) layer, a tungsten silicide layer, a nickel silicide layer, a cobalt silicide layer, a tantalum silicide layer, a doped Si layer, a doped Ge layer and a doped Si—Ge layer. In some embodiments, the first and second conductive layers 20 and 25 may comprise different materials from each other.

Material types of the first and second conductive layers 20 and 25 may be selected such that an oxide layer grown from the first conductive layer 20 is formed thicker than an oxide layer grown from the second conductive layer 25 under the same oxidation process conditions. For example, the first conductive layer 20 may comprise a titanium layer, and the second conductive layer 25 may comprise a tungsten layer. As another example, the first conductive layer 20 may comprise a polysilicon layer, and the second conductive layer 25 may comprise a metal layer.

In other embodiments, the first conductive layer 20 may comprise a material having etch selectivity with respect to the second conductive layer 25.

In still other embodiments, the second conductive layer 25 may comprise a conductive material having a higher electrical conductivity than the first conductive layer 20.

In still further embodiments, the second conductive layer 25 may have a second thickness t2 that is greater than a first thickness t1 of the first conductive layer 20.

A mask 30 may be formed on the second conductive layer 25. The mask 30 may be formed of an insulating material such as, for example, a silicon nitride layer or a silicon oxide layer.

Referring to FIG. 1B, the second conductive layer 25, the first conductive layer 20, the second dielectric layer 15 and the data storage layer 10 may be sequentially etched using the mask 30 as an etch mask to form a data storage pattern 10a, a second dielectric pattern 15a, a first preliminary conductive pattern 20a and a second conductive pattern 25a, which are sequentially stacked on the substrate 1. The first dielectric layer that is between the data storage pattern 10a and the substrate 1 may be referred to herein as a first dielectric pattern 5a.

Referring now to FIG. 1C, an oxidation process may be performed to grow a thicker oxide layer on a sidewall of the first preliminary conductive pattern 20a as compared to the second conductive pattern 25a. For example, an oxidation process may be performed under a gas atmosphere including an oxidation gas such as NO. Alternatively, a selective oxidation process may be performed in which an oxide layer is grown from the first conductive pattern 20a (e.g., a doped polysilicon layer) under a gas atmosphere that includes an oxidation gas such as NO and an antioxidant gas such as hydrogen that will reduce or prevent oxidation of a metal layer (e.g., the second conductive layer 25a).

In this manner, a sidewall oxide layer 35 may be provided on sidewalls of the first preliminary conductive pattern 20a.

The sidewall oxide layer 35 may be grown from the first preliminary conductive pattern 20a. The sidewall oxide layer 25 may comprise oxygen and an element that is used to form the first preliminary conductive pattern 20a. As a result of the oxidation process, the width of the first preliminary conductive pattern 20a is reduced to define a first conductive pattern 20b that has a smaller width W1 than the width W3 of the second conductive pattern 25a. As shown in FIG. 1C, the width W1 of the first conductive pattern 20b may also be smaller than the width W2 of the second dielectric pattern 15a. In some embodiments, the widths W2 and W3 may be the same.

While the conductive pattern 20b having the reduced width W1 may be formed via an oxidation process as described above with respect to FIG. 1C, it will be appreciated that the present invention is not limited thereto. For example, in other embodiments, the first preliminary conductive pattern 20a of FIG. 1B may be selectively etched to form a first conductive pattern 20c having a width W1 that is smaller than a width W3 of the second conductive pattern 25a and/or a width W2 of the second dielectric layer 15a as illustrated in FIG. 2. By way of example, an isotropic etching process may be performed in which the first preliminary conductive pattern (20a of FIG. 1B) is selectively etched.

Next, a method of fabricating a semiconductor device according to further embodiments of the present invention will be described below with reference to FIGS. 3A to 3C.

Referring to FIG. 3A, a first dielectric layer 105, a data storage layer 110 and a second dielectric layer 115, which are sequentially stacked, may be formed on a substrate 100, in the same manner described above with reference to FIGS. 1A-1C. A first conductive layer, a second conductive layer and a mask 130, which are sequentially stacked, may be formed on the second dielectric layer 115. The first and second conductive layers may be etched using the mask 130 as an etch mask to form a preliminary conductive pattern 120a and a second conductive pattern 125a, which are sequentially stacked.

Referring to FIG. 3B, in order to reduce the width of the preliminary conductive pattern (120a of FIG. 3A), substantially the same oxidation process as is described above with reference to FIG. 1C may be performed. As a result, a first conductive pattern 120b having a smaller width than the second conductive pattern 125a may be formed, and a sidewall oxide layer 135 may be formed on a sidewall of the first conductive pattern 120b.

Referring to FIG. 3C, the second dielectric layer (115 of FIG. 3B) and the data storage layer 110 may be sequentially etched using the mask 130 as an etch mask. As a result, a data storage pattern 110a and a second dielectric pattern 115a, which are sequentially stacked, may be formed. As shown in FIG. 3C, the sidewall oxide layer 135 may also be partially etched during this etching process. The first dielectric layer that is between the data storage pattern 110a and the substrate 100 may be referred to herein as a first dielectric pattern 105a.

In yet further embodiments, while the second dielectric layer (115 of FIG. 3B) and the data storage layer (110 of FIG. 3B) are etched, the sidewall oxide layer 135 may function as a mask to prevent the width of the second dielectric pattern 115a from being reduced. If the total width of the sidewall oxide layer 135 and the first conductive pattern 120b is greater than the width of the second conductive pattern 125a, the second dielectric pattern 115a may have a greater width than the second conductive pattern 125a, as the second dielectric pattern 115a may have a width that is equal to the total width of the sidewall oxide layer 135 and the first conductive pattern 120b after the etching process is completed.

FIGS. 4A and 4B illustrate yet another method of fabricating a semiconductor device according to embodiments of the present invention.

Referring to FIG. 4A, a first dielectric layer 205, a data storage layer 210, and a second dielectric layer 215, which are sequentially stacked, may be formed on a substrate 200, in the same manner described above with reference to FIGS. 1A-1C. A first conductive layer, a second conductive layer and a mask 230, which are sequentially stacked, may be formed on the second dielectric layer 215. The first and second conductive layers may be etched using the mask 230 as an etch mask to form a preliminary conductive pattern and a second conductive pattern 225a, which are sequentially stacked.

In order to reduce the width of the preliminary conductive pattern, substantially the same oxidation process as the oxidation process described with reference to FIGS. 1A-1C may be performed, or, alternatively, substantially the same method as described with reference to FIG. 2 may be used to selectively and isotropically etch the preliminary conductive pattern. As a result, a first conductive pattern 220b having a smaller width than the second conductive pattern 225a may be formed.

Subsequently, an insulating spacer 235 may be formed on sidewalls of the first conductive pattern 220b, the second conductive pattern 225a, and the mask 230, which are sequentially stacked. In some embodiments, the insulating spacer 235 may be omitted.

Referring to FIG. 4B, the second dielectric layer (215 of FIG. 4A) and the data storage layer (210 of FIG. 4A) may be sequentially etched using the mask 230 and the insulating spacer 235 as etch masks. As a result, a data storage pattern 210a and a second dielectric pattern 215a, which are sequentially stacked, may be formed. The second dielectric pattern 215a may have a greater width than the first and second conductive patterns 220b and 225a. The first dielectric layer that is between the data storage pattern 210a and the substrate 200 may be referred to herein as a first dielectric pattern 205a. In embodiments where the insulating spacer 235 is omitted, the second dielectric layer (215 of FIG. 4A) and the data storage layer (210 of FIG. 4A) may be sequentially etched using the mask 230 as an etch mask.

According to example embodiments, a data storage pattern, a blocking dielectric pattern, a first conductive pattern and a second conductive pattern, which are sequentially stacked, can be provided. The first conductive pattern can be provided to have a smaller width than the second conductive pattern and/or the blocking dielectric pattern. Therefore, since an electron back-tunneling phenomenon at an edge of the first conductive pattern, which may be caused by an electric field, can be reduced during an erase operation of the flash memory device, and the erase operating characteristics of the flash memory device can be enhanced.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a first dielectric pattern on a semiconductor substrate;
    a data storage pattern on the first dielectric pattern;
    a second dielectric pattern on the data storage pattern so that the data storage pattern is between the first and second dielectric patterns;
    a first conductive pattern that is directly on the second dielectric pattern;
    a second conductive pattern on the first conductive pattern so that the first conductive pattern is between the second dielectric pattern and the second conductive pattern; and
    a sidewall insulating layer on a sidewall of the first conductive pattern, wherein the sidewall insulating layer directly contacts an upper surface of the second dielectric pattern and a lower surface of the second conductive pattern, and
    wherein the first conductive pattern has a first width that is less than a second width of the second conductive pattern and that is less than a third width of the second dielectric pattern.

2. The device of claim 1, wherein sidewalls of the second conductive pattern are vertically aligned with sidewalls of the second dielectric pattern.

3. The device of claim 1, wherein the second dielectric pattern has a third width that is greater than the second width.

4. The device of claim 1, wherein the first conductive pattern comprises a first material and the second conductive pattern comprises a second material that is different from the first material, and wherein the data storage pattern is a charge trap layer of a non-volatile memory device.

5. The device of claim 1, wherein sidewalls of the second conductive pattern are vertically aligned with sidewalls of the second dielectric pattern and wherein the second conductive pattern is thicker than the first conductive pattern.

6. The device of claim 5, wherein the second conductive layer has a higher electrical conductivity than the first conductive layer.

7. The device of claim 1, wherein sidewalls of the sidewall insulating layer are not aligned with sidewalls of the second conductive pattern.

* * * * *